United States Patent
Duan

(10) Patent No.: US 9,887,666 B2
(45) Date of Patent: Feb. 6, 2018

(54) JUNCTION BOX FOR SOLAR CELL

(71) Applicant: ZHEJIANG RENHE PHOTOVOLTAIC TECHNOLOGY CO., LTD., Cixi, Zhejiang Province (CN)

(72) Inventor: Lijun Duan, Zhejiang Province (CN)

(73) Assignee: ZHEJIANG RENHE PHOTOVOLTAIC TECHNOLOGY CO., LTD., Cixi (CN)

( * ) Notice: Subject to any disclaimer, the term of this patent is extended or adjusted under 35 U.S.C. 154(b) by 0 days.

(21) Appl. No.: 15/351,176

(22) Filed: Nov. 14, 2016

(65) Prior Publication Data
US 2017/0353152 A1    Dec. 7, 2017

(30) Foreign Application Priority Data
Jun. 3, 2016  (CN) .......................... 2016 1 0385642

(51) Int. Cl.
H01L 31/052    (2014.01)
H02S 40/34     (2014.01)
H02G 3/08      (2006.01)
H01L 31/05     (2014.01)
H01L 31/044    (2014.01)
H01L 31/02     (2006.01)

(52) U.S. Cl.
CPC ...... *H02S 40/345* (2014.12); *H01L 31/02021* (2013.01); *H01L 31/044* (2014.12); *H01L 31/0504* (2013.01); *H02G 3/081* (2013.01)

(58) Field of Classification Search
CPC ............. H01L 31/02021; H01L 31/044; H01L 31/052; H01L 31/0504; H01L 31/054
See application file for complete search history.

(56) References Cited

U.S. PATENT DOCUMENTS

| | | | | |
|---|---|---|---|---|
| 8,289,742 B2* | 10/2012 | Adest | ................... | G01S 3/7861 363/71 |
| 8,324,921 B2* | 12/2012 | Adest | ...................... | H02S 50/10 324/761.01 |
| 8,369,113 B2* | 2/2013 | Rodriguez | .............. | H02M 7/48 363/132 |
| 8,384,243 B2* | 2/2013 | Adest | ................ | H01L 31/02021 307/43 |
| 2006/0054210 A1* | 3/2006 | Proisy | ................... | H01L 31/048 136/244 |
| 2008/0149170 A1* | 6/2008 | Hanoka | ................... | H02S 40/34 136/251 |

(Continued)

Primary Examiner — Golam Mowla
(74) Attorney, Agent, or Firm — Jiwen Chen

(57) ABSTRACT

The present invention discloses a junction box for a solar cell. The junction box includes a box body, wherein the box body is provided with a plurality of conducting pieces for connecting solar cell pieces; two adjacent conducting pieces are connected by a diode; the conducting pieces at both ends are connected to the outside parts via a guide line respectively; and the forward dissipation power of the diode in the middle is less than that of the diodes at both sides. According to the invention, the diode with lower forward dissipation power is employed in parts where the temperature rise is easily produced to reduce the temperature rise; while the diode with higher forward dissipation power is employed in parts where the temperature rise is not easily produced to control cost.

5 Claims, 5 Drawing Sheets

(56) References Cited

U.S. PATENT DOCUMENTS

| | | | | |
|---|---|---|---|---|
| 2009/0206666 A1* | 8/2009 | Sella | H01L 31/02021 | 307/43 |
| 2010/0002349 A1* | 1/2010 | La Scala | H01L 31/02021 | 361/90 |
| 2011/0132431 A1* | 6/2011 | Linderman | H01L 31/02021 | 136/246 |
| 2011/0215643 A1* | 9/2011 | Freyermuth | H01L 31/02021 | 307/43 |
| 2011/0273015 A1* | 11/2011 | Adest | H01L 31/02021 | 307/43 |
| 2012/0194003 A1* | 8/2012 | Schmidt | H01L 31/02021 | 307/116 |
| 2012/0268087 A1* | 10/2012 | Kernahan | H01L 31/02021 | 323/234 |

\* cited by examiner

JUNCTION BOX FOR SOLAR CELL

This application claims the priority benefit of Chinese Application No. 201610385642.7, filed Jun. 3, 2016, which is hereby incorporated by reference.

TECHNICAL FIELD

The present invention belongs to the field of solar power generation technology, and more particular, to a junction box for a solar cell.

BACKGROUND ART

In the field of solar power generation, a junction box is a vital accessory. Electric current produced by solar cell pieces needs to be gathered via the junction box to be output. In the prior art, the junction box structure includes a box body, the box body is provided with a plurality of conducting pieces for connecting the solar cell pieces; a plurality of diodes are connected among various conducting pieces and connected with component cell pieces for bypass; and the conducting pieces at both ends are connected to the outside via a guide line, respectively.

In the prior art, the main problem faces by the junction box is heating. The conducting pieces and diodes will heat up when the current passes through. If the temperature is too high, the normal use of those parts will be affected. In order to solve these problems, two solutions are generally adopted. One solution is to reduce the power consumption of the diodes so as to reduce heating; and the other solution is to enlarge the surface of the conducting piece to increase the heat dissipation surface so as to accelerate the heat dissipation. However, both of the methods will increase the cost of the junction box.

The Japanese Patent JP4699060 discloses a solar cell junction box, wherein different heat dissipation areas are designed according to the temperature rise degrees of the different conducting pieces so as to make the best use of all heat dissipation areas, thus preferably balancing the heat dissipation effect and the manufacturing cost.

SUMMARY OF THE INVENTION

An object of the present invention is to provide a junction box for a solar cell, which can economically and reasonably reduce the heating.

Therefore, the technical scheme employed in the present invention is as follows: a junction box for a solar cell comprising a box body, wherein the box body is provided with a plurality of conducting pieces for connecting with the solar cell pieces; two adjacent conducting pieces are connected by a diode; the conducting pieces at both ends are connected to the outside parts via a guide line respectively; characterized in that the forward dissipation power of the diode in the middle is less than that of the diodes at both sides.

The present invention is also suitable for a module product in which a chip and a conducting piece are packaged, and the diode in the present invention refers to the chip in the module product. Furthermore, the present invention is also suitable for the product with parallelly connected diodes, that is to say, two diodes or diode chips are connected between two conducting pieces at the same time. At this time, two diodes or diode chips are connected in parallel as a group. The forward dissipation power represents the overall forward dissipation power of the group of diodes or diode chips.

As a further technical scheme, the box body is provided with N+1 conducting pieces connected by N diodes, and the power dissipation of each diode satisfies the following conditions:

when N is an even number, formula I is satisfied if counting from any direction;
when N is an odd number, formula II is satisfied if counting from any direction;

$$P_{N/2} \leq P_{N/2-1} \leq \ldots < P_1 \quad \text{Formula I}$$

$$P_{(N+1)/2} \leq P_{(N+1)/2-1} \leq \ldots < P_1 \quad \text{Formula II}$$

wherein: P is the forward dissipation power, and the subscript represents the sequence of the diodes.

In the above formulas, the subscript with bracket expresses that the overall in the bracket is numerator or denominator; while the subscript without bracket expresses that fraction operation is conducted first, and then addition and subtraction operation are conducted.

The method for measuring the forward dissipation power P is that: under equal conditions, certain forward current I is applied to the diode, and the voltage drop (V) at both ends of the diode is measured, $P = I*V$. Under the circumstances of different environmental conditions and different measurement current I, the measured P is different; but no matter what the measurement condition is, the measured forward dissipation power P accords with formula I or formula II as long as various diode (or diode group) are measured on equal conditions.

As the most common technical scheme, the box body is provided with four conducting pieces connected by three diodes, wherein the forward dissipation power of the diode in the middle is less than that of the diodes at both ends.

The difference of the forward dissipation power of the diode can be realized either by employing different models of diodes, or by setting different numbers of diodes to connect in parallel, or changing the technology to reduce the forward dissipation power.

After the diode is connected, the temperature of the junction box rises, and the heating source is mainly from the forward dissipation power of the diode. Therefore, heating can be reduced by decreasing the forward dissipation power of the diode so as to further reduce the temperature rise. But it does not seem desirable to blindly decrease the forward dissipation power of the diode because this will greatly increase the cost. A number of studies by applicant found that the temperature rise of the diodes in different places was different. As a whole, the temperature rise of the diode in the middle is greater than that of the diodes at both sides. Therefore, the applicant designs the technical scheme that the diode with lower forward dissipation power is employed in parts where the temperature rise is easily produced to reduce the temperature rise; while the diode with higher forward dissipation power is employed in parts where the temperature rise is not easily produced to control cost.

BRIEF DESCRIPTION OF THE DRAWINGS

The present invention is further described in details hereinafter by reference to the drawings and the exemplary embodiments of the present invention.

Figure 1:
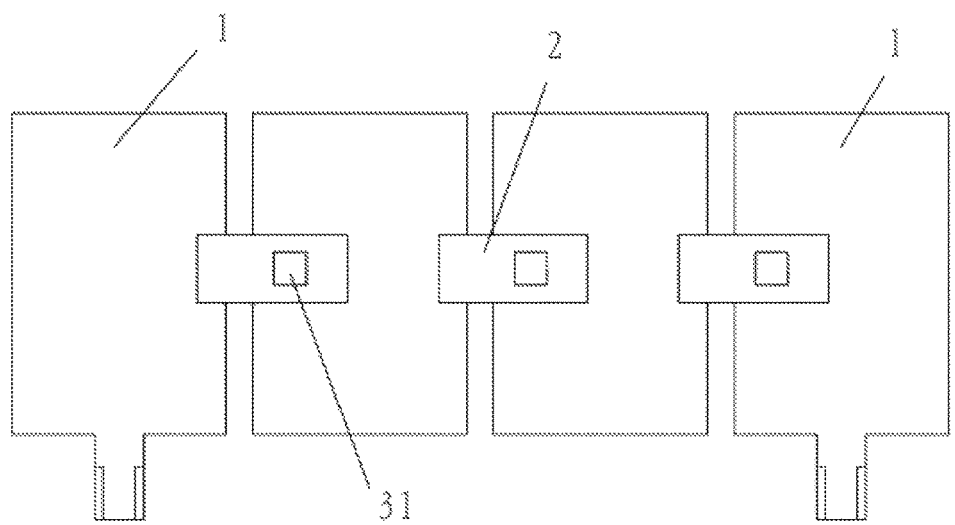
FIG. 1 is a structural schematic diagram of a junction box in the prior art.

Reference numerals in figures: conducting piece 1, diode 2, middle diode 21, two-end diode 22, first chip 31, second chip 32, third chip 33, trench/groove 34.

DETAILED DESCRIPTION OF THE PREFERRED EMBODIMENTS

Referring to the drawings, the junction box described in the embodiment comprises a box body, wherein the box body is provided with a plurality of conducting pieces 1 for connecting solar cell pieces; two adjacent conducting pieces 1 are connected by a diode 2; the conducting pieces 1 at both ends are connected to the outside via a busbar respectively; as illustrated in FIG. 1, in the prior art, the box body is provided with four conducting pieces 1 connected by three diodes 2, and the forward dissipation power of a first chip 31 on all the diode 2 is the same. It does not seem desirable as the cost is increased greatly once the forward dissipation power of the diode is reduced.

As the temperature rise of the diode in the middle is greater than that of the diodes at both sides, the method employed in the embodiment is that the forward dissipation power of the diode in the middle is reduced so as to be less than that of the chip of the diodes at both sides.

First Embodiment

Figure 2:
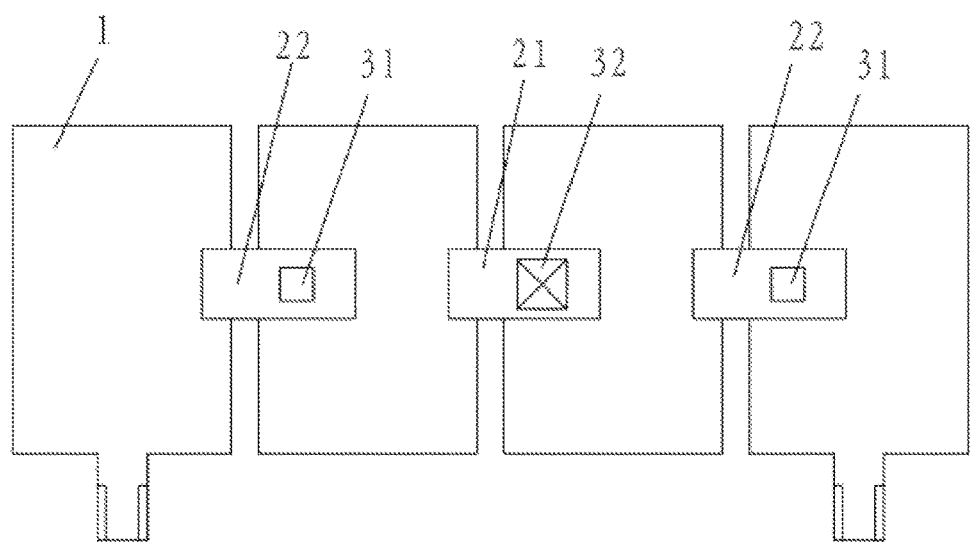
FIG. 2 is a structural schematic diagram of the first embodiment of the present invention.

As illustrated in FIG. 2, the box body of the embodiment is provided with four conducting pieces 1 for connecting solar cell pieces; two adjacent conducting pieces 1 are connected by a diode; the conducting pieces 1 at both ends are connected to the outside via a busbar respectively; wherein the model of a second chip 32 of the middle diode 21 is different from that of the first chip 31 of two-end diodes 22. The forward dissipation power is that galvanization I=15 A at the temperature of 25° C., the voltage drops V of the three diode chips are 0.5V, 0.4V and 0.5V respectively, and the forward dissipation powers of the three diode chips are P1=V*I=0.5*15=7.5 W, P2=V*I=0.4*15=6 W and P3=V*I=0.5*15=7.5 W. The forward dissipation power of the second chip 32 on the middle diode 21 is less than that of the first chip 31 on the two-end diode 22. Thus, the cost increase is controlled due to the decrease in heating.

Second Embodiment

Figure 3:
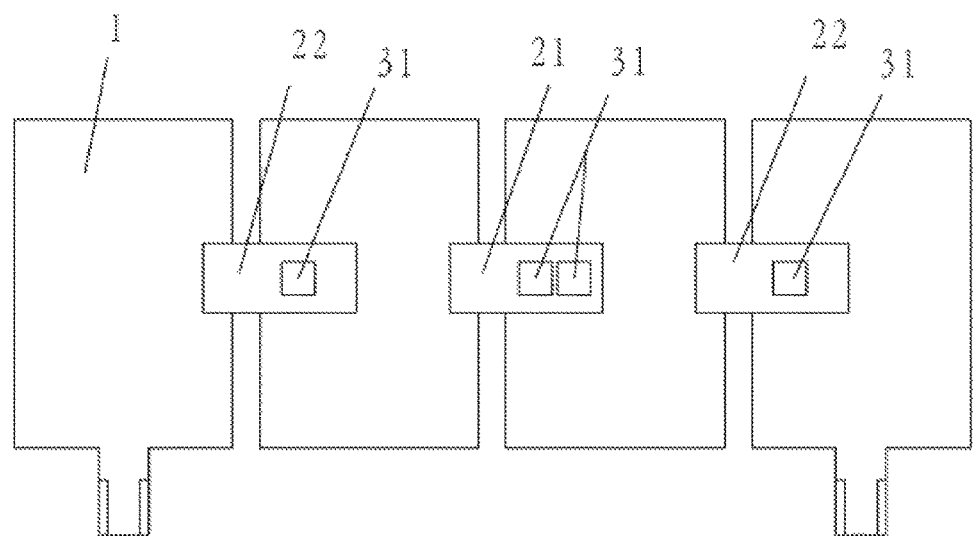
FIG. 3 is a structural schematic diagram of the second embodiment of the present invention.

As illustrated in FIG. 3, the box body of the embodiment is provided with four conducting pieces 1 for connecting solar cell pieces; two adjacent conducting pieces 1 are connected by a total of three diodes; the conducting pieces 1 at both ends are connected to the outside parts via a busbar respectively; wherein the middle diode 21 is connected parallelly with two first chips 31 respectively so that the forward dissipation power of the two first chips 31 on the middle diode 21 is less than that of the two-end diode 22. Thus, the cost increase is controlled due to the decrease in heating.

Third Embodiment

Figure 4:
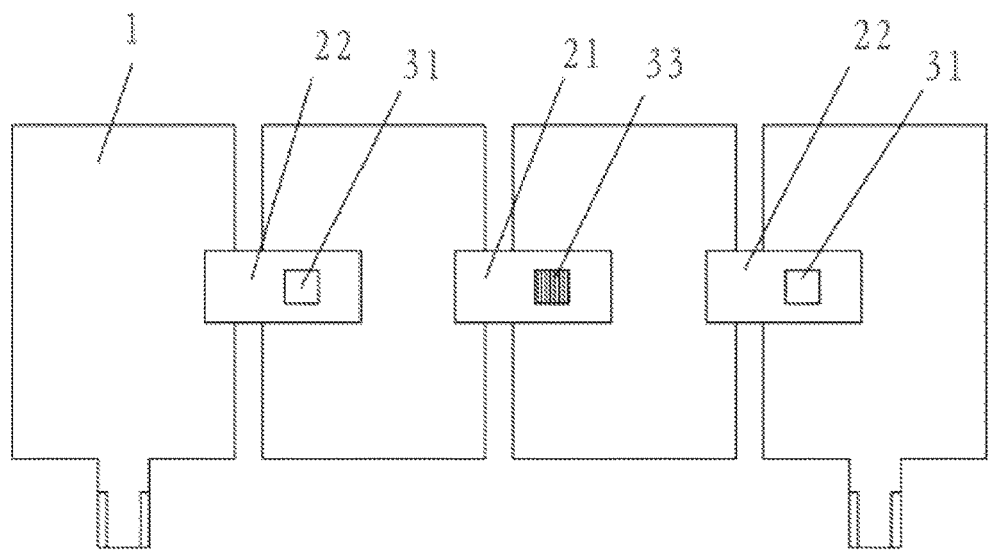
FIG. 4 is a structural schematic diagram of the third embodiment of the present invention.
Figure 5:
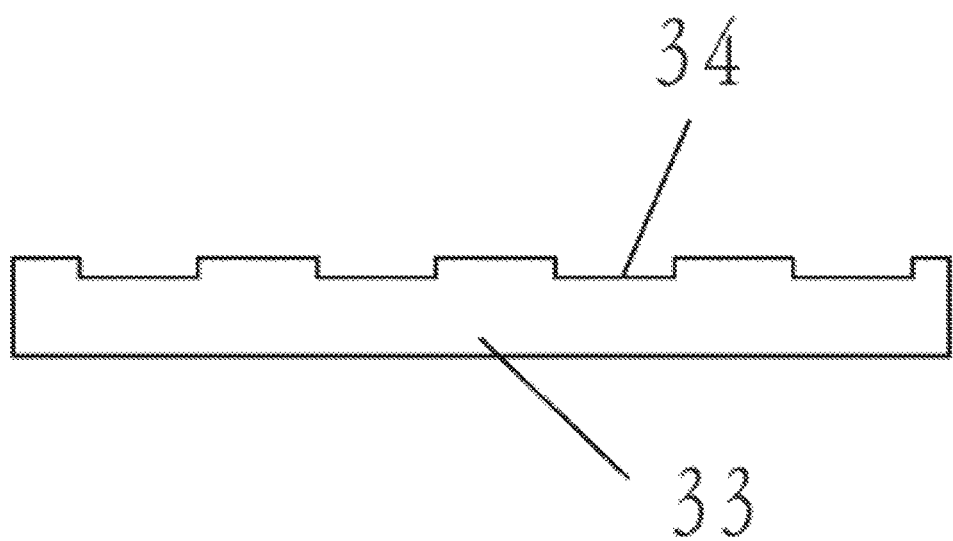
FIG. 5 is a side view of a middle diode chip of the third embodiment of the present invention.

As illustrated in FIG. 4, the box body of the embodiment is provided with four conducting pieces 1 for connecting solar cell pieces; two adjacent conducting pieces 1 are connected by a total of three diodes; the conducting pieces 1 at both ends are connected to the outside parts via a busbar respectively; wherein the surface of a third chip 33 on the middle diode 21 is provided with a trench or groove 34, the forward dissipation power of the third chip 33 is reduced by the trench/groove 34 so as to be less than that of the first chip 31 on the two-end diode 22. Thus, the cost increase is controlled due to the decrease in heating.

The invention claimed is:

1. A junction box for a solar cell, comprising a box body, wherein the box body is provided with a plurality of conducting pieces for connecting solar cell pieces; wherein two adjacent conducting pieces are connected by a diode; the conducting pieces at both ends are connected to outside parts via a guide line respectively; characterized in that a forward dissipation power of a diode in the middle is less than that of diodes at both sides, wherein the box body is provided with N+1 conducting pieces connected by N diodes and the power dissipation of each diode satisfies the following conditions:

when N is an even number, formula I is satisfied if counting from any direction;

when N is an odd number, formula II is satisfied if counting from any direction;

$$P_{N/2} \leq P_{N/2-1} \leq \ldots < P_1 \quad \text{Formula I}$$

$$P_{(N+1)/2} \leq P_{(N+1)/2-1} \leq \ldots P_1 \quad \text{Formula II}$$

wherein P is the forward dissipation power, and subscript represents the sequence of the diodes.

2. The junction box for the solar cell according to claim 1, wherein the box body is provided with four conducting pieces connected by three diodes, wherein the forward dissipation power of the diode in the middle is less than that of the diodes at both ends.

3. The junction box for the solar cell according to claim 1, wherein the difference of the forward dissipation power of the diodes is realized by employing different models of diodes.

4. The junction box for the solar cell according to claim 1, wherein the difference of the forward dissipation power of the diodes is realized by setting different number of diodes that are parallelly connected.

5. The junction box for the solar cell according to claim 1, wherein the difference of the forward dissipation power of the diodes is realized by changing the process so that the positive power dissipation is reduced by.

* * * * *